United States Patent [19]
Crabill et al.

[11] Patent Number: 5,907,244
[45] Date of Patent: May 25, 1999

[54] METHOD AND APPARATUS FOR DETECTING WINDING ERRORS IN AN ELECTRIC MOTOR STATOR

[75] Inventors: Monty L. Crabill, New Carlisle; Robert C. Storar, Beavercreek, both of Ohio

[73] Assignee: Automation Technology, Inc., Dayton, Ohio

[21] Appl. No.: 08/899,430

[22] Filed: Jul. 24, 1997

Related U.S. Application Data

[60] Provisional application No. 60/023,005, Aug. 2, 1996.

[51] Int. Cl.$^6$ ..................................................... G01R 31/06
[52] U.S. Cl. ............................ 324/546; 324/772; 324/545
[58] Field of Search ..................................... 324/545, 546, 324/547, 772, 219, 220, 263; 73/116, 514.39; 340/648; 318/490; 322/99

[56] References Cited

U.S. PATENT DOCUMENTS

| | | | |
|---|---|---|---|
| 1,687,637 | 10/1928 | Reynders | 324/772 |
| 4,658,213 | 4/1987 | Finley | 324/546 |
| 5,218,860 | 6/1993 | Storar | 73/116 |
| 5,252,915 | 10/1993 | Sedding et al. | 324/545 |
| 5,341,095 | 8/1994 | Shelton et al. | 324/545 |

OTHER PUBLICATIONS

"Direction Test Considerations", "Direction Test Description", Automation Technololgy, Powerpoint presentation 1996 Motor Manufacturing Conference, Aug. 1996, Dayton, Ohio.

STS–3500 Stator Test System product brochure, Automation Technology.

Stator Test System STS–700/3000 Series Automatic Test System product brochure, Automation Technology (undated).

*Primary Examiner*—Diep N. Do
*Attorney, Agent, or Firm*—Biebel & French

[57] ABSTRACT

A method and apparatus for detecting winding errors in electric motor stators having a plurality of field windings is disclosed. The method involves the steps of applying a current source to at least one of the field windings to generate a magnetic field within the stator, measuring the polarity and strength of the field for each winding at preselected radial and angular positions about a circumference of the stator bore, and comparing the measured values to recorded values of radially and angularly corresponding measurements for a reference motor stator. Preferably, the current source is applied to each of the windings in succession. The apparatus includes a terminal block, switch, and power supply to connect a source of current to each field winding in succession to generate a magnetic field within the stator. In one embodiment, the apparatus includes a magnetic sensor mounted at a predetermined radial position for rotation on a shaft, and an encoder proximate the shaft to determine the angular position of the shaft. In a second embodiment, the apparatus includes a plurality of magnetic sensors mounted at preselected radial and angular positions about an arbor or drum sized to fit within the stator. Both embodiments include means for comparing the measured magnetic field values to recorded values of radially and angularly corresponding measurements for a reference motor stator.

16 Claims, 20 Drawing Sheets

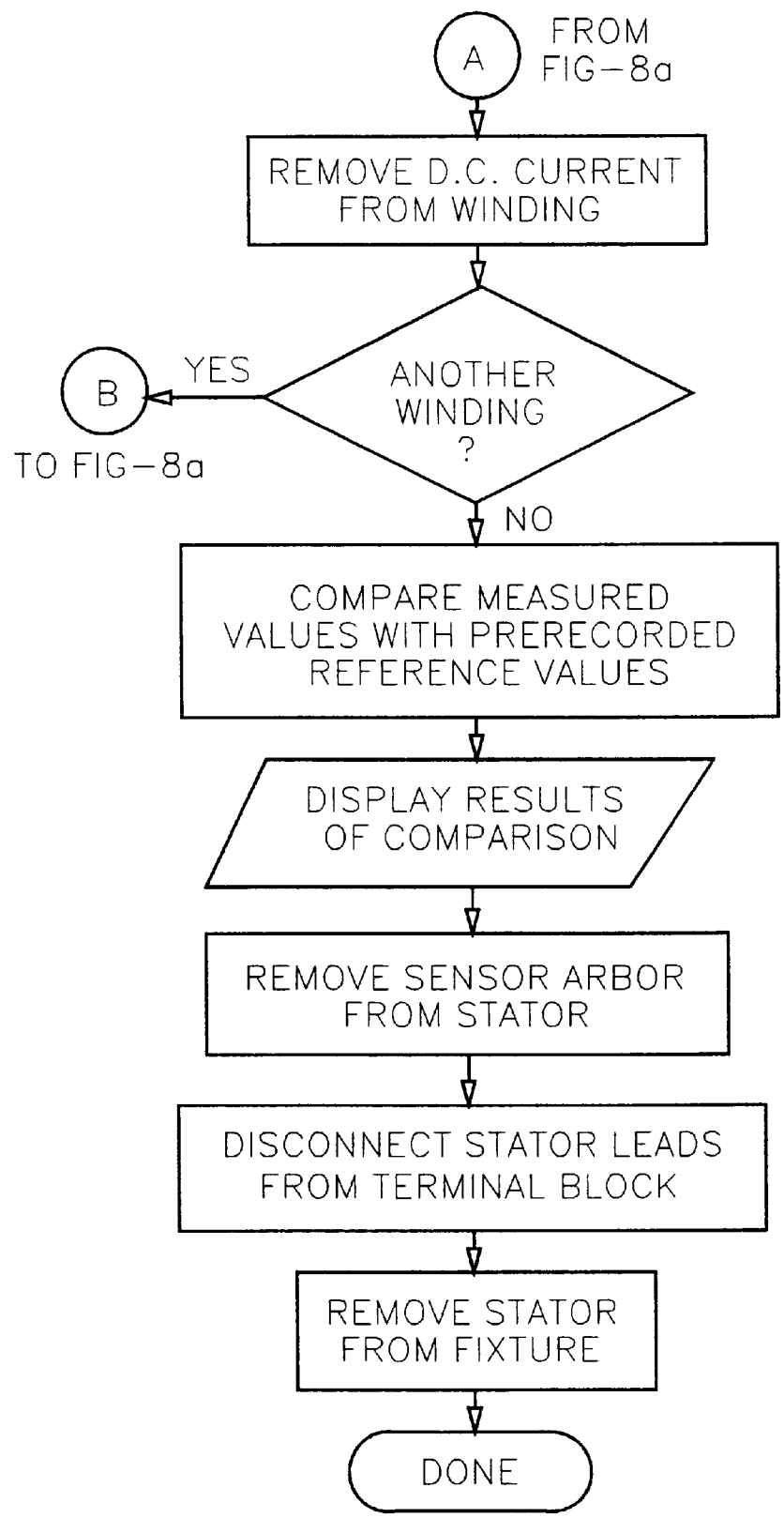

METHOD AND APPARATUS FOR DETECTING WINDING ERRORS IN AN ELECTRIC MOTOR STATOR

CROSS-REFERENCE TO RELATED APPLICATIONS

Benefit of the co-pending U.S. Provisional Application entitled "MOTOR STATOR TEST SYSTEM", Ser. No. 60/023,005, filed Aug. 2, 1996.

BACKGROUND OF THE INVENTION

The invention relates to the field of testing equipment for motor stators, and more particularly to equipment for testing stators for induction, stepping, and universal motors. Specifically, the invention relates to a method and apparatus for determining whether stator windings have been properly installed on an electric motor stator prior to final assembly of the motor.

Electric motors generally have a stationary part, known as a stator, and a rotating part, known as a rotor. Upon application of current to the motor, the rotor rotates relative to the stator, thereby converting electrical energy to mechanical energy. Typically, the stator has a generally cylindrical shape and annular cross-section with a longitudinally extending bore. The rotor is mounted on bearings and extends within the stator substantially the length of the bore. The stator is usually made of many thin laminations of iron or steel, each having the same cross-section as the overall stator, stacked one upon the other to build up the stator from end to end. Each of the laminations has a series of radially inwardly extending teeth with slots in between. When the laminations are stacked together, the teeth and slots cooperate to form slots that extend longitudinally the length of the stator. Conductors are laid within the longitudinally extending slots and wound or looped around the teeth to form field windings or coils. In operation, current is applied to external leads of the field windings to create magnetic fields within the stator. These magnetic fields interact with magnetic fields generated by the rotor to cause the rotor to turn.

Using modern manufacturing methods well known in the art, stators are commonly manufactured on production lines wherein the field windings are either wound directly on the stator by means of automated winding equipment, or are first wound by automated winding equipment and then fit into the stator slots in a process known as shed winding. In either process, the windings are intended to be wound in a specified direction, with a specified number of turns spanning a specified number of teeth, and with a predetermined absolute orientation within the stator. This ensures that the magnetic field produced by each winding when energized will have the correct position, polarity and strength to ensure proper operation of the motor when assembled.

However, the number of turns per winding, or the direction of the wound conductors, or the number of teeth spanned, or the absolute angular placement of the winding, can sometimes be incorrect due to problems with the manufacturing process. If a manufacturing defect is not discovered until after final assembly of the motor, then the motor must either be scrapped or undergo an expensive rebuild. Moreover, all of the production line operations performed on the motor after introduction of the fault will have gone to waste, increasing the overall cost of production. Also, waiting until after final assembly to discover a manufacturing defect can increase the difficulty in diagnosing the source of the problem and cause delay in correcting the problem.

Therefore, it is desirable to test motors and motor parts at various times throughout the manufacturing process in order to give immediate feedback as to the proper operation of the various manufacturing processes, to prevent wasted manufacturing steps on faulty motor parts, and catch repairable faulty motor parts when it is most economical to repair or replace them. For example, one method for testing electric motor stators on an assembly line comprises the steps of clamping the stator under test in a fixture, connecting the field windings to a source of power, inserting a test rotor into the stator, and applying power to the stator. If the rotor turns in the proper direction when the stator is energized, then it is assumed that the field windings are properly wound.

However, it has been discovered that stator windings have sometimes been wound in the wrong direction so as to produce a magnetic field with the wrong polarity, yet the test rotor has still turned in the proper direction. Also, it has been observed that the number of turns per winding can vary from the specified amount without producing a noticeable difference in the direction of rotation of the test rotor. This is undesirable in that improper turn ratios can lead to reduced motor efficiency and shortened motor life. In addition, many motors are optimized to run most efficiently when the windings have a specific angular placement with respect to the stator core. A simple direction test may not indicate improper winding placement.

Therefore, it is desirable to be able to test electric motor stators prior to final motor assembly to determine whether the field windings have been wound in the proper direction, with the proper number of turns per windings, with the windings spanning the proper number of teeth, and with the proper angular placement. Furthermore, it is desirable to be able to test electric motor stators in an automated fashion compatible with modern manufacturing processes. Moreover, it is desirable to be able to test electric motor stators in a way that permits accurate determination of stator faults and provides timely feedback as to possible sources of error in the manufacturing process.

SUMMARY OF THE INVENTION

In normal operation, a.c. electric motors have currents of alternating polarity applied to the stator field windings, while d.c. electric motors have currents of constant polarity applied to them. In either case, the currents flowing through the field windings produce magnetic fields within the stator. Each of these fields may be represented mathematically by a vector function having a magnitude and direction at each point in the field which is the sum of contributions from current flows at each point of the winding. In accordance with the present invention, test currents are applied to each of the stator windings, and the resulting magnetic fields are mapped. Winding errors then are detected by comparing measured values of magnetic field components at a series of points with corresponding values for a reference stator known to be properly wound.

Thus, a method of detecting winding errors in an electric motor stator may comprise the steps of: applying a current source of predetermined amplitude and frequency to each field winding in succession thereby to produce a magnetic field within the stator, measuring the strength and the polarity of the resulting magnetic field at a plurality of predetermined angular positions within the stator, and comparing the resulting measured values to values of angularly corresponding values for a reference stator.

If an a.c. current source is used, then the currents applied to the field windings must be synchronized in phase with the currents applied to the reference stator windings for comparison. It has been found, however, that faults may be detected in field windings for stators to be used in both a.c. and d.c. electric motors by using a d.c. current source of predetermined amplitude.

The invention provides an improved method and apparatus for detecting winding errors in electric motor stators having a plurality of field windings and produced for use in induction, stepping, and universal motors, and the like, prior to final assembly of said motors. A direct current source of predetermined amplitude is applied to at least one of the field windings of a stator thereby to generate a magnetic field within the stator. For each of the field windings under test, and during the application of the direct current source thereto, sensing signals are generated representing a component of a magnetic field vector at each of a plurality of radially fixed and angularly displaced positions within the stator. The generated sensing signals are compared to recorded values of radially and angularly corresponding sensing signals for a known good reference motor stator having no winding errors therein.

In one embodiment of the invention, the stator to be tested has a d.c. current source of fixed magnitude applied to each of the field windings in turn. For each energized field winding, a magnetic field sensor mounted on a rotatable shaft is inserted into the bore of the stator with the sensor in close proximity to the stator teeth. The sensor is rotated at least one full revolution within the stator bore. The polarity and magnitude of the component of the magnetic field perpendicular to the bore wall is measured and recorded for a plurality of preselected angular positions. The measured values are then compared to the angularly corresponding values for a reference stator.

In an alternative preferred embodiment of the invention, the magnetic sensor on the shaft is replaced by a drum or arbor having a plurality of magnetic field sensors located at preselected angular positions about the circumference of the drum or arbor. With such an arrangement, there is no need to rotate the sensors to map the magnetic field within the stator. The magnetic field values for each of the sensors is read in turn to generate a map of the magnetic field.

Therefore, it is an object of the invention to provide an improved method and apparatus for detecting winding errors in an electric motor stator.

Other objects and advantages of the invention will be apparent from the following description, the accompanying drawings and the appended claims.

BRIEF DESCRIPTION OF THE DRAWINGS

FIGS. 8a, 8b are a flowchart detailing a method of detecting winding errors in a motor stator in accordance with the invention;

DETAILED DESCRIPTION OF THE PREFERRED EMBODIMENT

Figure 1:
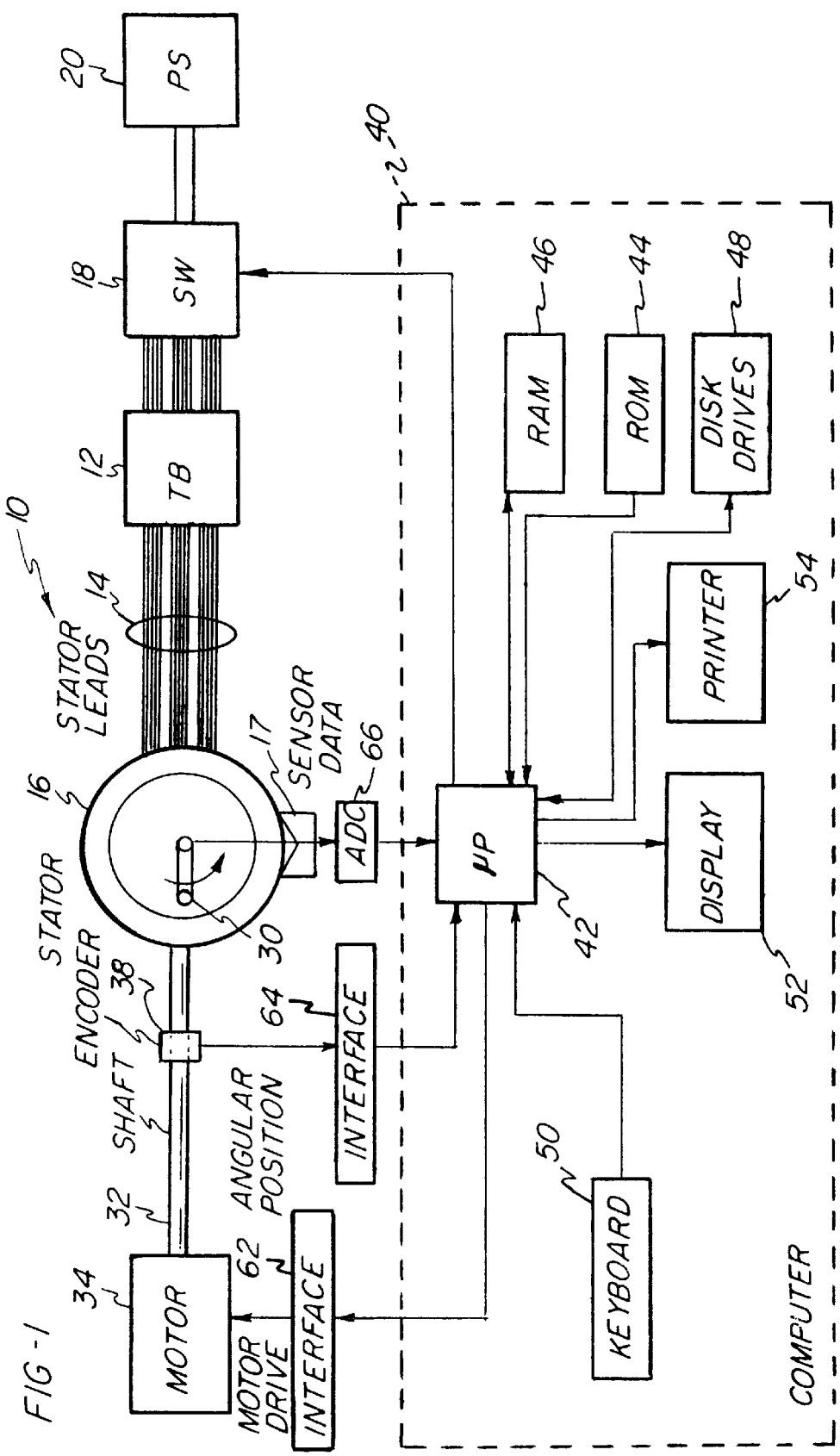
FIG. 1 is a block diagram of an improved winding error detecting apparatus of the invention.
Figure 2:
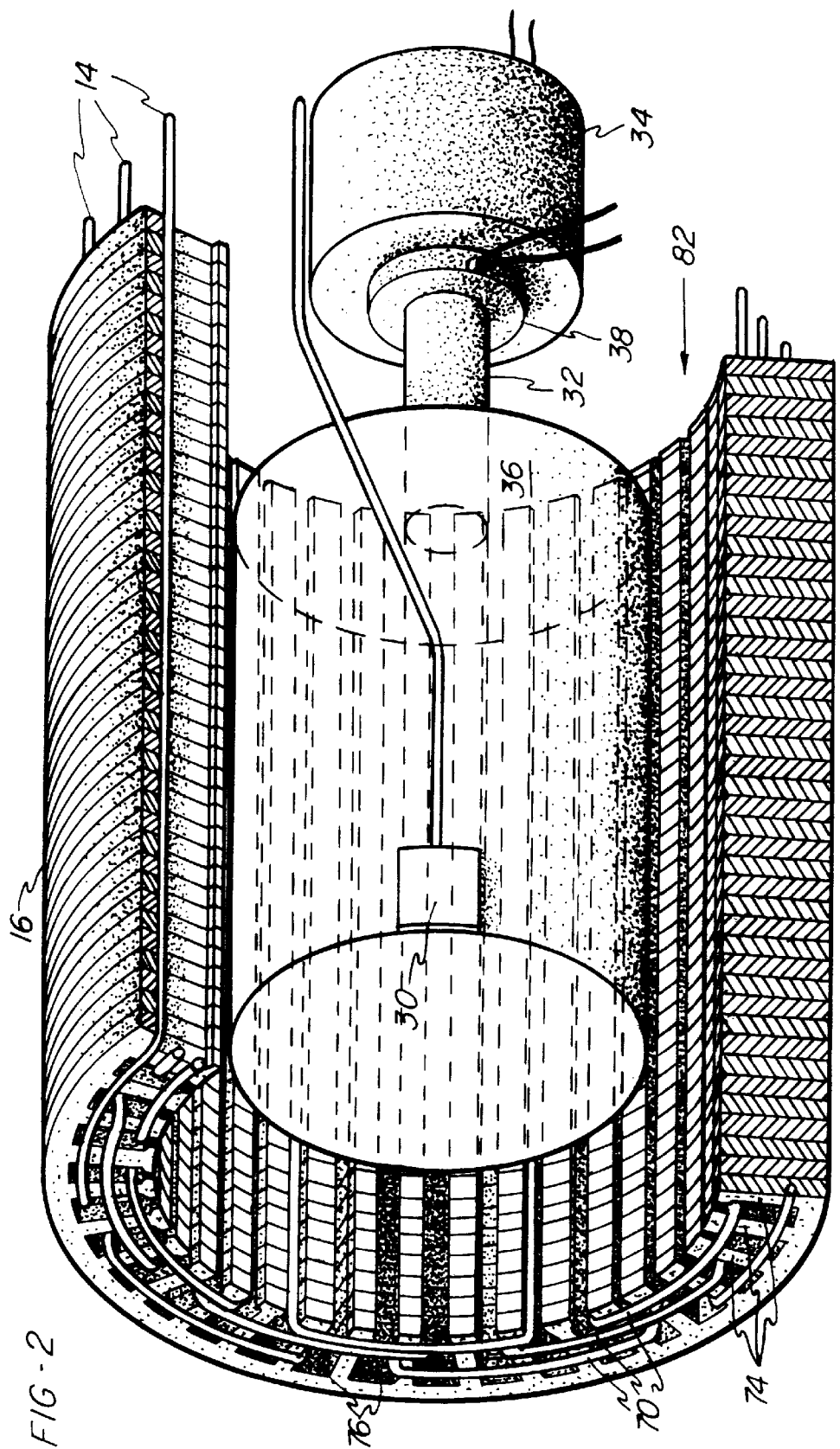
FIG. 2 is a partial section view of a magnetic sensor on a rotatable drum inserted into a stator having windings.

Referring first to FIGS. 1 and 2, an electric motor stator winding error detecting apparatus 10 of the present invention includes a terminal block 12 for temporarily attaching or connecting external field winding leads 14 of an electric motor stator 16, a fixture 17 adapted to hold the stator 16, a d.c. current switch 18 for selectively applying or supplying a d.c. current of preselected magnitude to the stator leads 14 via terminal block 12, and a power supply 20 for providing the d.c. current of preselected magnitude In addition, the winding error detector 10 includes a magnetic field sensor 30, for measuring polarity and magnitude of a magnetic field within the stator 16, mounted for rotation on a shaft 32, which is driven by a motor 34. The sensor 30 may be mounted by any suitable means, including directly on the shaft, on the end of an arm projecting perpendicularly from the shaft, or on a drum or arbor 36. The magnetic sensor 30 may be of any suitable type, but is preferably a Hall-effect device. A Hall device is an electromagnetic conversion device that converts magnetic flux density into voltage. When a current of predetermined value is passed through a semiconductor chip, and a perpendicular magnetic field is introduced, a voltage perpendicular to both the current and the magnetic flux is generated. Thus, by impressing upon a Hall device a current or voltage of predetermined value, a voltage representative of magnetic field intensity and polarity may be generated. Hall devices are commercially available from, among others, Sharp Electronics Company of Japan. The preferred Hall device is an A3515, available from Allegro Microsystems, Inc. of Worcester, Mass.

Mounted proximate the shaft 32 is an encoder 38 for sensing the angular position of the shaft 32, and the sensor 30. The encoder 38 may be of any suitable type, including magnetic or mechanical, but is preferably an optical device well known in the art. An example of one such optical encoder is a type E25BB-4H-12,500-M5-AB-8830LED-SC18 encoder made by BEI Motion Systems. This encoder has A and B tracks to permit monitoring of the direction of the rotation of the shaft 32.

The detector or tester 10 is controlled by a computer 40 that comprises a microprocessor 42 connected for ruing a testing or error detecting program, operating a d.c. current switch 18, controlling a motor 34, and receiving data from a magnetic sensor 30 and an encoder 38. The computer 40 further comprises a read-only memory (ROM) 44 for storing an operating system for the computer 40, a random-access memory (RAM) 46 for temporarily storing data and program information, and disk drives 48 for program and data storage. Disk drives 48 may include a hard drive and a floppy disk drive. The computer 40 includes a keyboard 50 for entering operator commands and other information, a visual display unit 52 for displaying information to an operator, and a printer 54 for printing a hardcopy report of test results. The computer 40 may optionally include other input/output devices (not shown) such as a bar-code reader, a plotter, a modem, an RS-232 interface, and an IEEE-488 interface.

The winding fault detector 10 further comprises a motor interface unit 62 for converting the motor control signals from the microprocessor 42 to a form suitable for driving the motor 34, an encoder interface unit 64 for converting the encoder 38 output to a form suitable for input to the microprocessor 42, and an analog-to-digital converter 66 for converting the analog output of the magnetic sensor 30 to digital form for input to the microprocessor 42.

Figure 3:
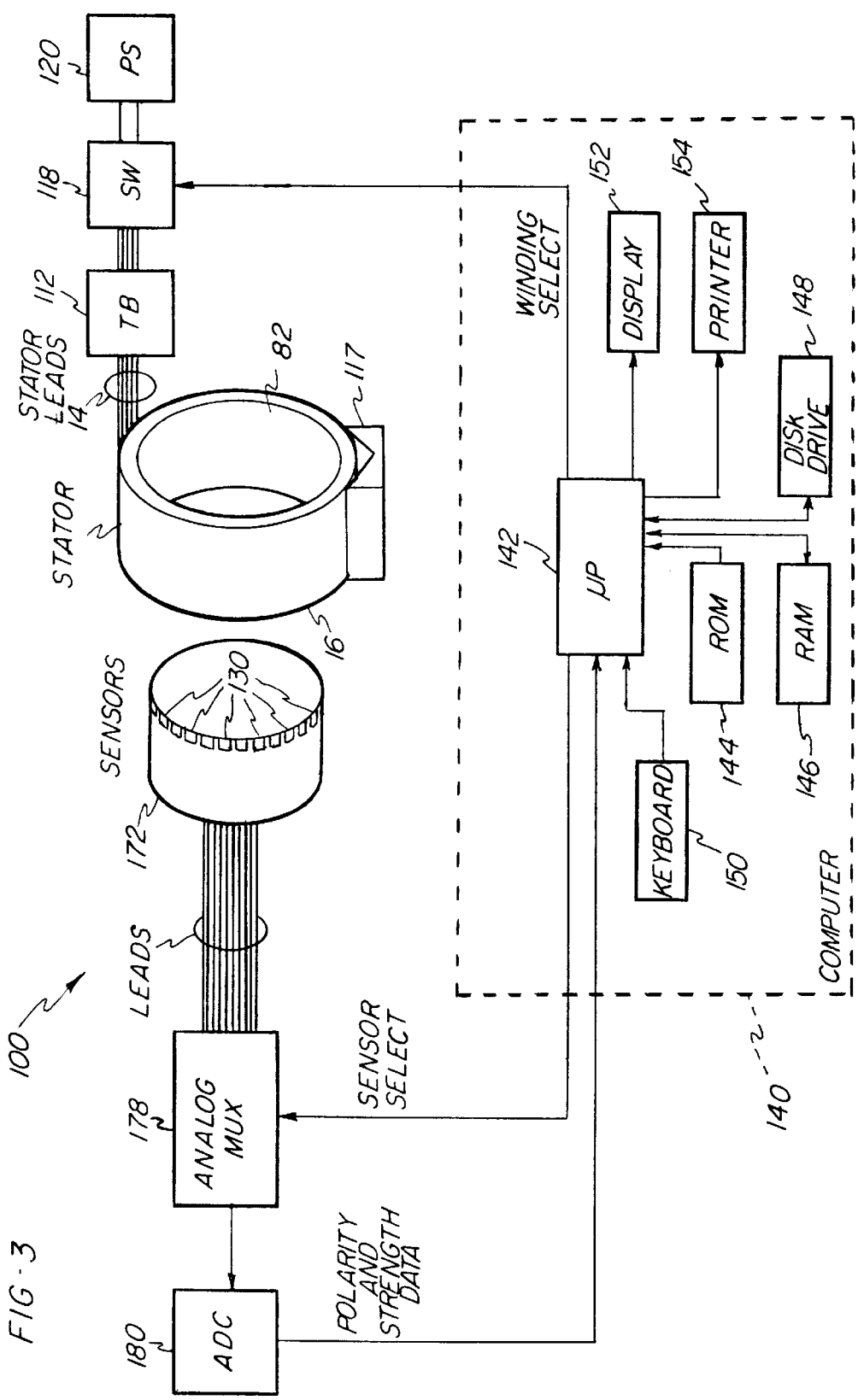
FIG. 3 is a block diagram of an alternative preferred embodiment of a winding error detecting apparatus of the invention.
Figure 4:
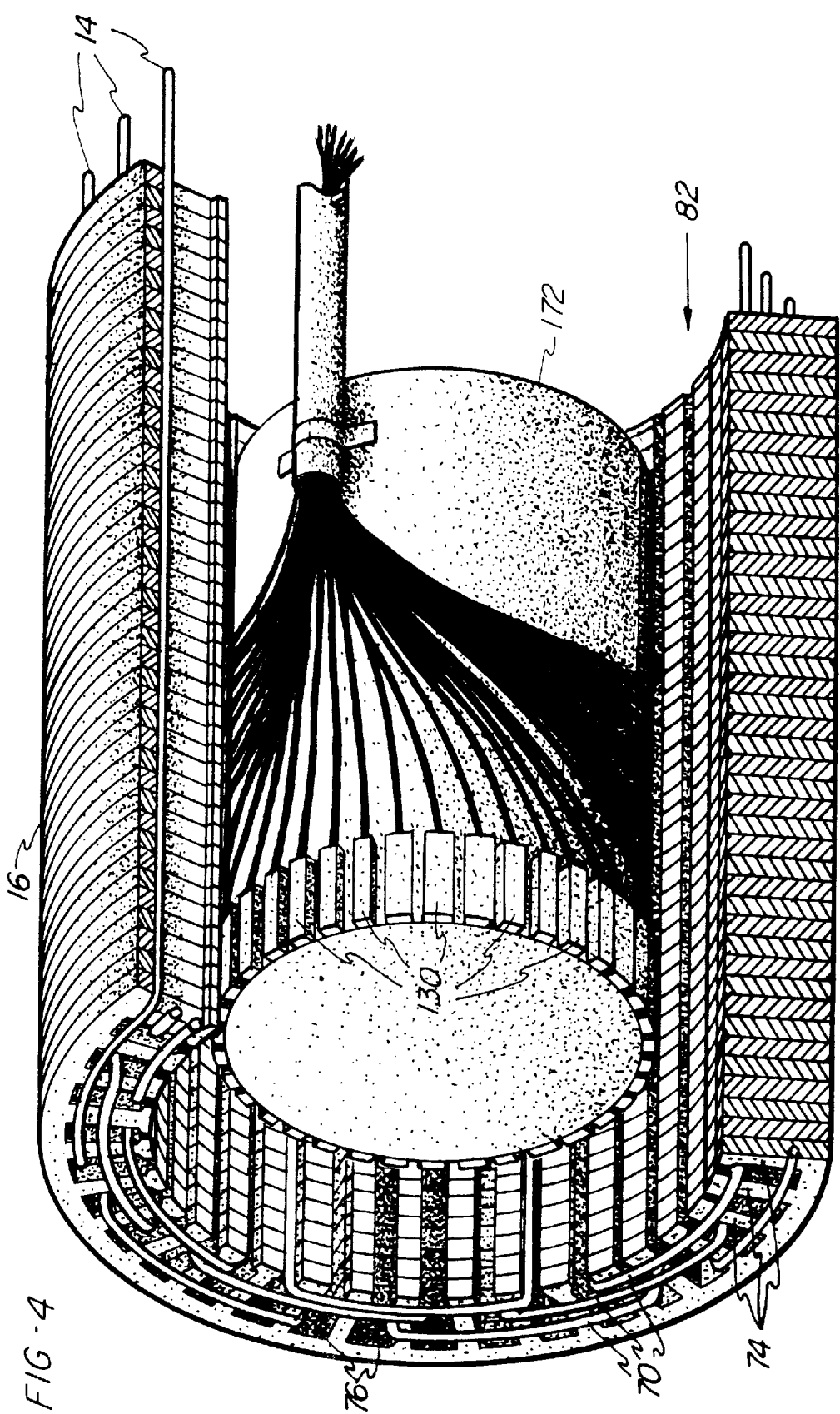
FIG. 4 is a partial section view of a plurality of magnetic sensors at preselected angular positions about a drum inserted into a stator having windings.

Referring to FIGS. 3 and 4, an alternative embodiment 100 of the winding error detecting apparatus is shown. The detector or tester 100 includes a terminal block 112, a fixture 117, a d.c. current switch 118, and a power supply 120. The detector 100 also includes a computer 140 comprising a microprocessor 142, a ROM 144, a RAM 146, disk drives 148, a keyboard 150, a visual display unit 152, and a printer 154.

The alternative embodiment of the winding testing apparatus differs from the first embodiment primarily in the means for generating sensing signals representing a component of a magnetic field vector within the stator 16 when one or more of its field windings 70 are energized with a d.c. current. The detector 100 includes a plurality of magnetic field sensors 130 mounted about the periphery of a drum or arbor 172. The arbor 172 is preferably cylindrical and sized to fit within the stator 16 with the sensors 130 located closely adjacent the stator teeth 74. The sensors 130 are located at a plurality of preselected angularly and radially disposed positions about the arbor 172, with the arrangement being preferably symmetrical and uniform about the circumference of the arbor 172. The number of sensors 130 depends upon the desired degree of resolution, with higher resolution requiring more sensors 130. Preferably, there are at least as many of the sensors 130 as the expected maximum number of stator teeth 74 or slots 76 of the stator 16.

The outputs from the sensors 130 serve as inputs to an analog multiplexer 178. The analog multiplexer 178 receives a sensor select signal from the microprocessor 142 for selecting one of the sensor 130 outputs and switching the output to an analog-to-digital converter (ADC) 180. The ADC 180 converts the selected sensor 130 analog output to a digital form appropriate for input to the microprocessor 142.

Figure 5:
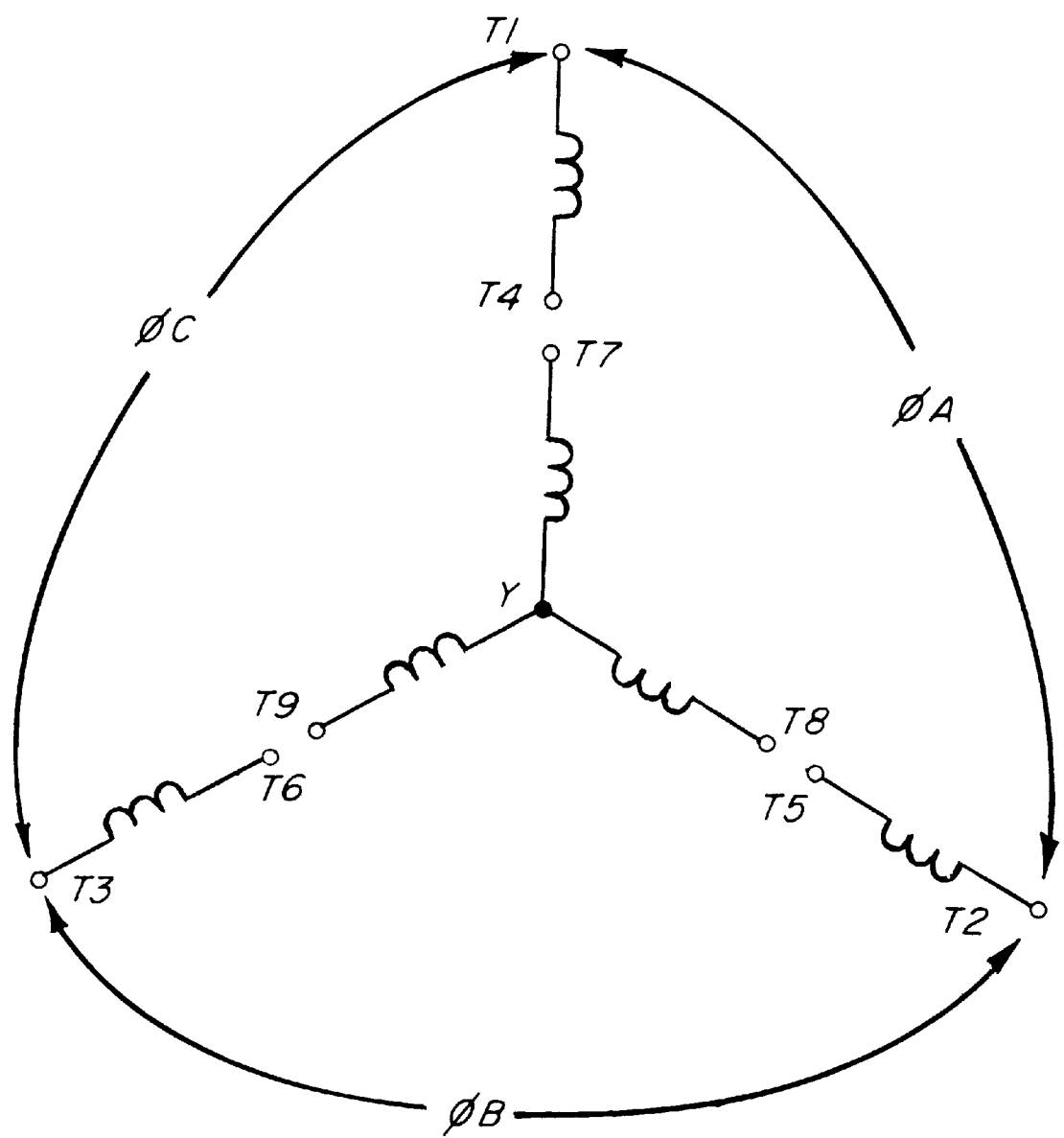
FIG. 5 is an electrical schematic representation of field windings of an electric motor stator.

In FIG. 5, a three-phase, six-pole, wye-connected electric motor stator is shown in electrical schematic fashion. The stator has six windings 70 and nine externally available terminals T1–T9. These terminals are connected to the terminal block 118 or 118 during testing and permit a d.c. current of a known value to be applied to each field winding 70 in succession. In FIG. 5, the windings ruing from T1 through T4, T7, T8, and T5 to T2 represent phase A, while the windings running from T2 through T5, T8, T9, and T6 to T3 represent phase B, and the windings running from T3 through T6, T9, T7, and T4 to T1 represent phase C.

Figure 6:
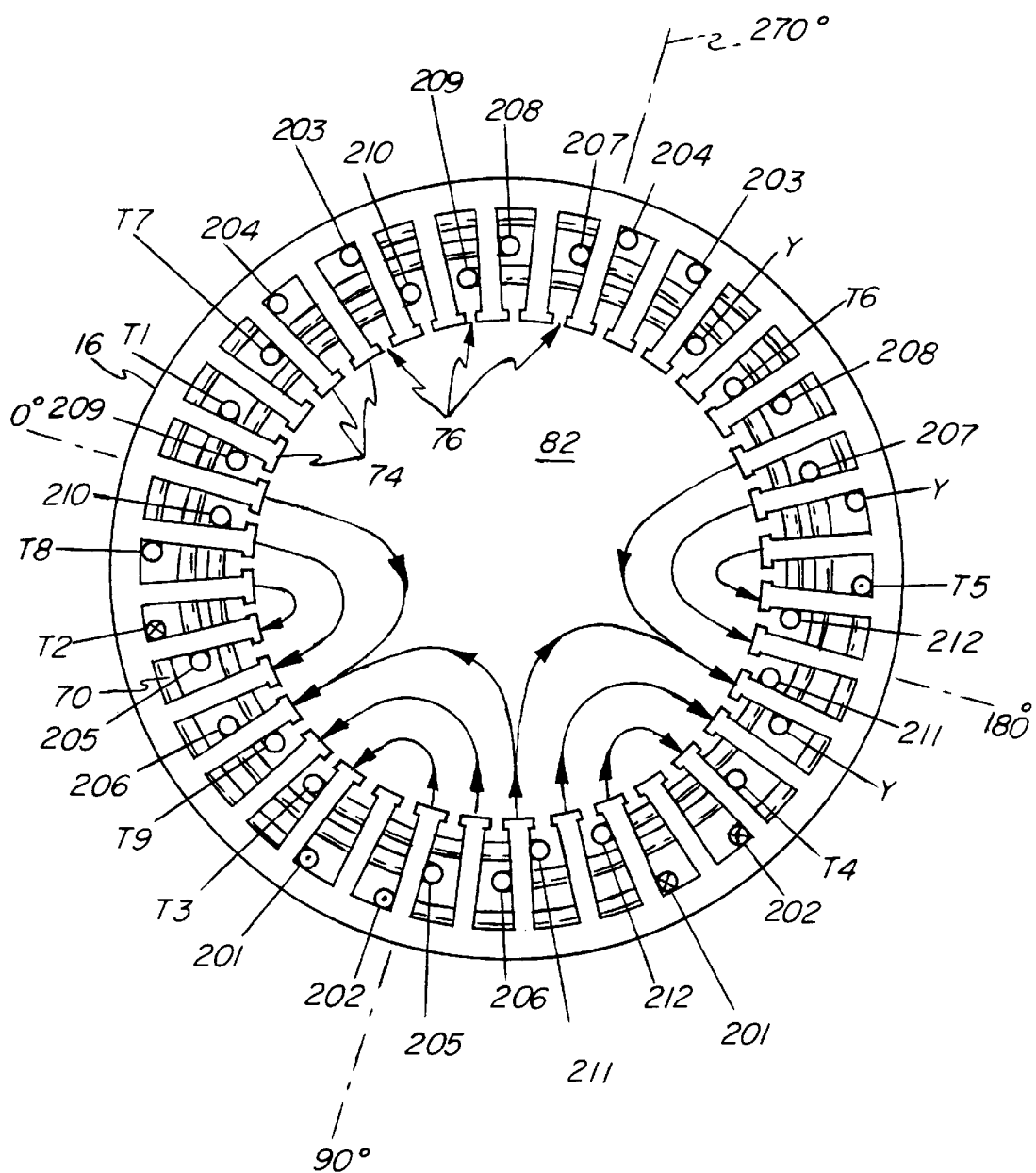
FIG. 6 is a cross-section view of a stator as viewed along its longitudinal axis showing a magnetic field inside the stator resulting from an energized field winding.

In FIG. 6, a cross-sectional view of the ree-phase, six-pole, wye-connected electric motor stator of FIG. 5 is shown with each of the like numbered wires connected together. It may be seen that there are 36 stator teeth 74 and stator slots 76, with the wiring running longitudinally within each slot 76 corresponding to one field winding 70 only. A d.c. current is shown applied to terminals T2 to T5, with current flowing into the plane of the FIG. 6 depicted as an X and current flowing out of the plane of the FIG. 6 depicted as a point or dot (•). The lines of the magnetic field resulting from the current are shown as a series of curved arrows in the plane of the FIG. 6, with the arrows pointing away from north magnetic poles and toward south magnetic poles. Of course, the precise form of the resulting magnetic field will depend upon the number of windings energized, whether the windings are connected in series or parallel arrangement, and the direction of current flow, among other things.

As may be seen from FIG. 6, each field winding 70, when energized with current, produces a magnetic field having a plurality of magnetic poles. The magnetic field lines originate on north magnetic poles and terminate on south magnetic poles. When a magnetic sensor 30 (not shown), disposed adjacent the stator teeth 74, is rotated about the circumference of the stator bore 82, the sensor 30 cuts through the lines of the magnetic field adjacent the stator teeth 74. If the sensor 30 is mounted such that it is oriented parallel to the stator teeth 74 it confronts, then the sensor 30 generates a sensing signal representative of the polarity and strength of the component of the magnetic field oriented perpendicularly to the stator teeth 74. In other words, the sensor measures values for the component of the magnetic field vector parallel to a line running perpendicularly to the longitudinal axis of the stator through the sensor.

Alternatively, a plurality of magnetic sensors 130 (not shown), preferably numbering at least 36 for this example, may be disposed adjacent the stator teeth 74 about the circumference of the stator bore 82. With each sensor 130 oriented parallel to the circumference of the stator bore 82, the sensors 130, when activated, generate a sensing signal representative of the polarity and strength of the component of the magnetic field oriented perpendicularly to the circumference of the stator bore 82.

Figure 7:
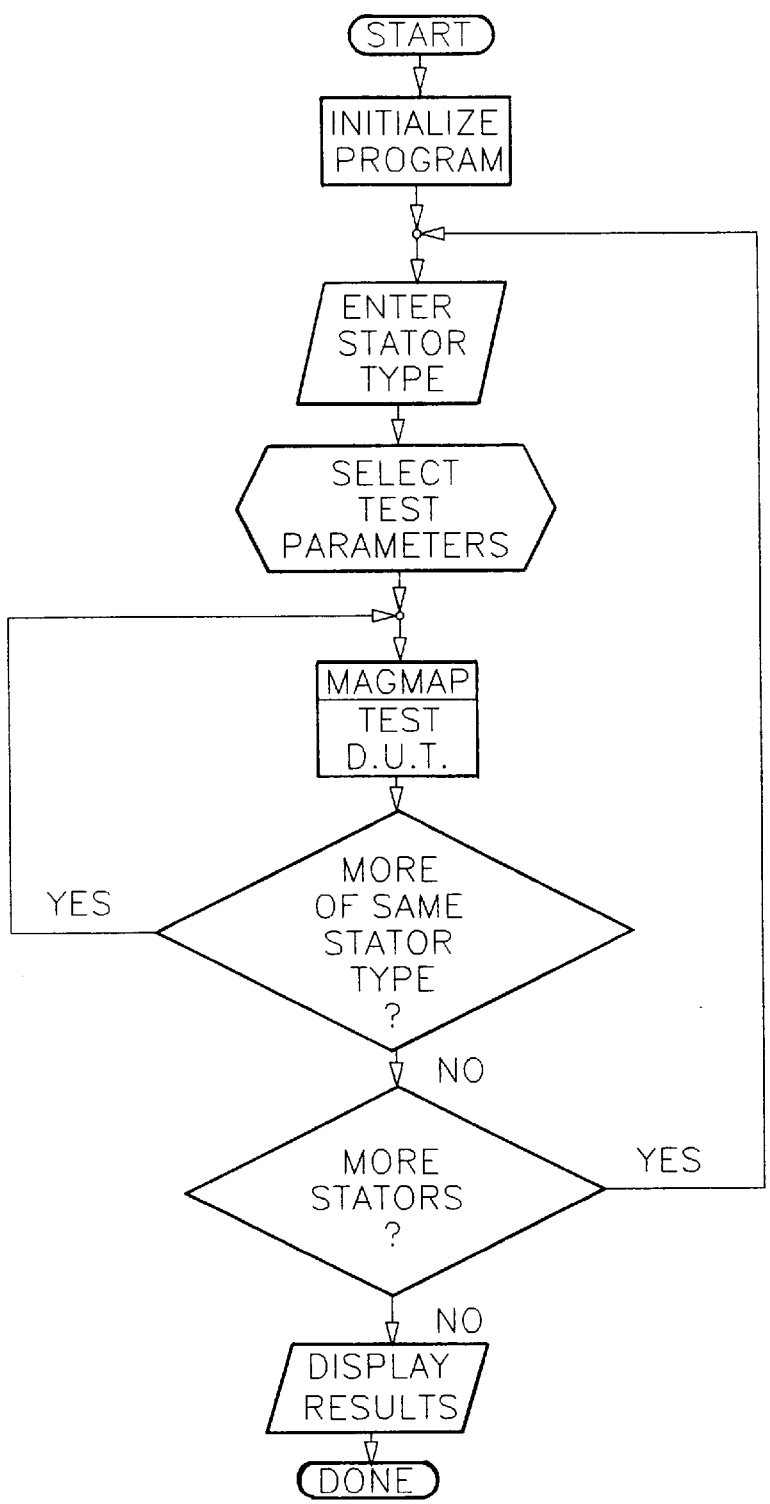
FIG. 7 is a flowchart detailing an overall method for detecting winding errors in an electric motor stator.

A flowchart depicting a method of detecting winding errors in electric motor stators on a production line is shown in FIG. 7. After the testing equipment has been appropriately initialized, the type of stator to be tested is entered into a computer controlling the testing process. The stator type may be entered manually by an operator by means of a keyboard or a bar-code scanner, or automatically as a stator moves past a sensor. Based upon the stator type, the appropriate test parameters are retrieved from a data storage device and used to control the testing of the particular type of stator.

In accordance with the method of the present invention, a stator under test has each of its field windings energized by a d.c. current in succession. The resulting magnetic fields are sensed and the measured values recorded to produce a magnetic map. The measured values are then compared with corresponding stored reference stator values. The results for each stator tested are displayed to provide immediate feedback as to the condition of the windings of the stator. While the present invention is directed to determining winding errors in a stator by means of mapping the magnetic fields within the stator, other tests, such as surge tests and resistance tests, may be performed in conjunction with the present test.

Testing continues until all stators to be tested have been tested. Results may then be displayed for individual stators tested, or a report for the entire run of stators tested may be printed, as desired. Statistics for the testing process may be conveniently gathered and stored to prepare historical reports to spot potential developing trends over time and help identify possible problem areas in the stator manufacturing process, and more particularly, in the stator winding process.

Figure 8A:
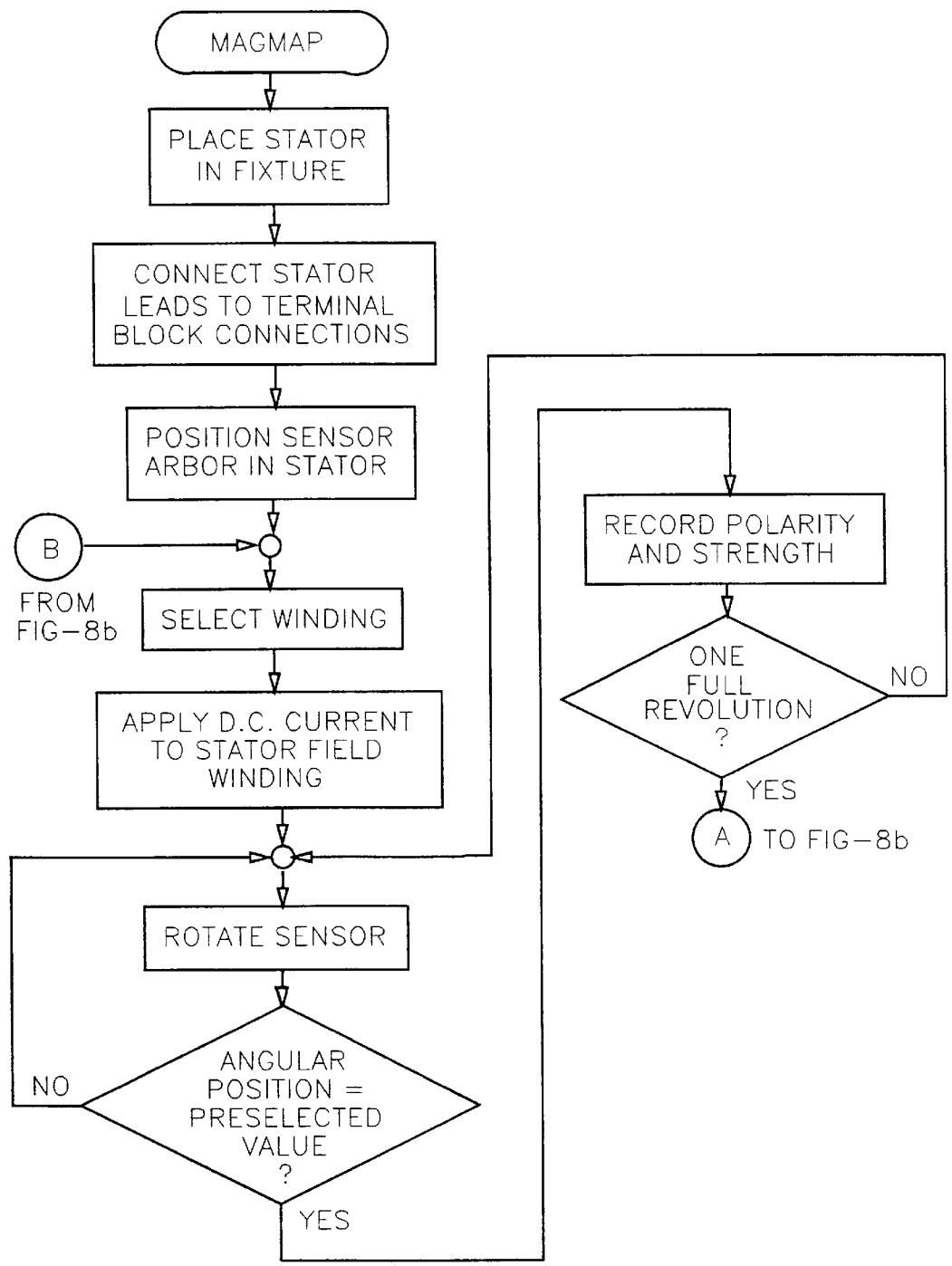
Figure 9A:
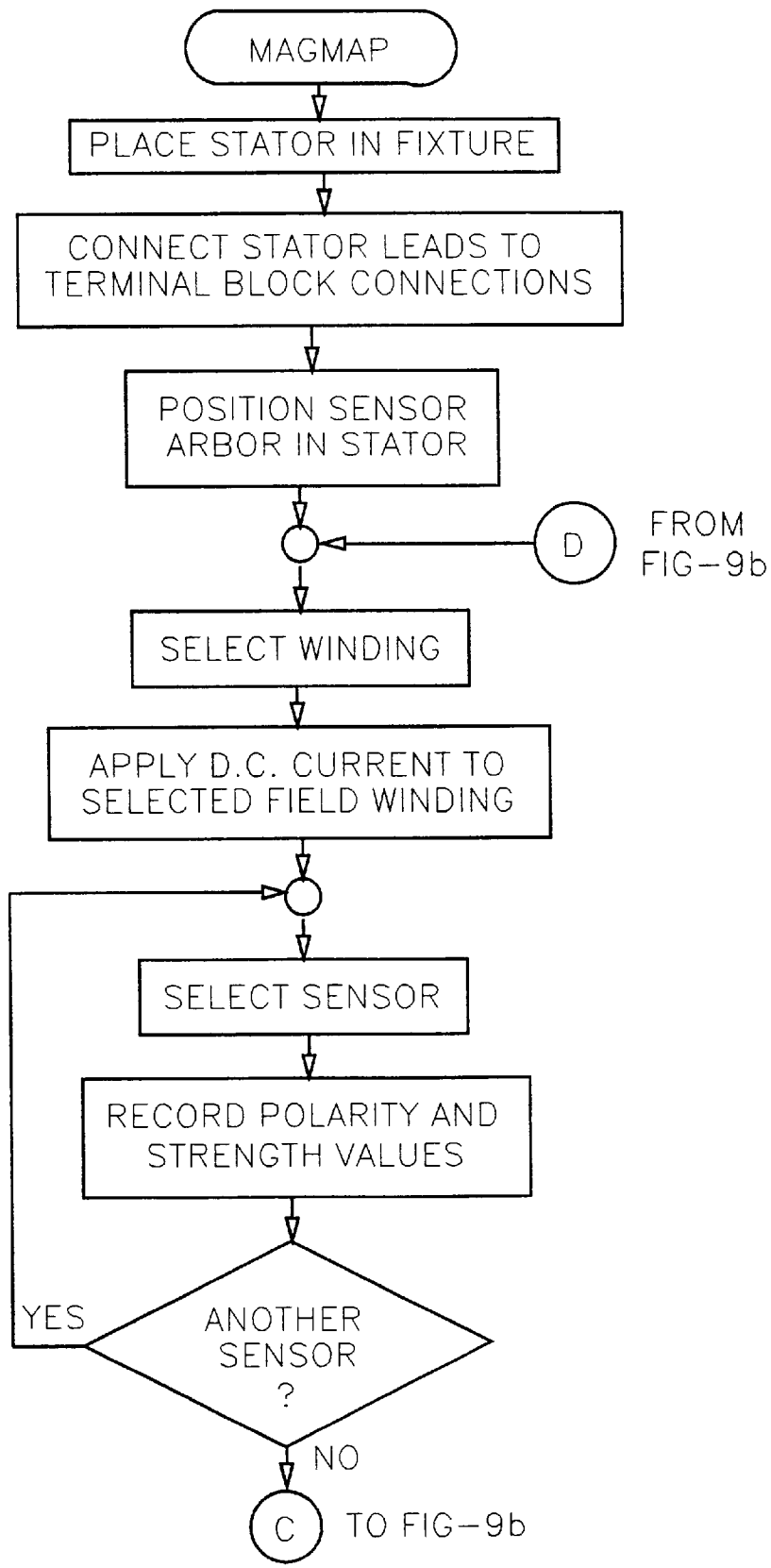
FIGS. 9a, 9b are a flowchart detailing an alternative embodiment of the method of detecting winding errors in a motor stator in accordance with the invention.
Figure 9B:
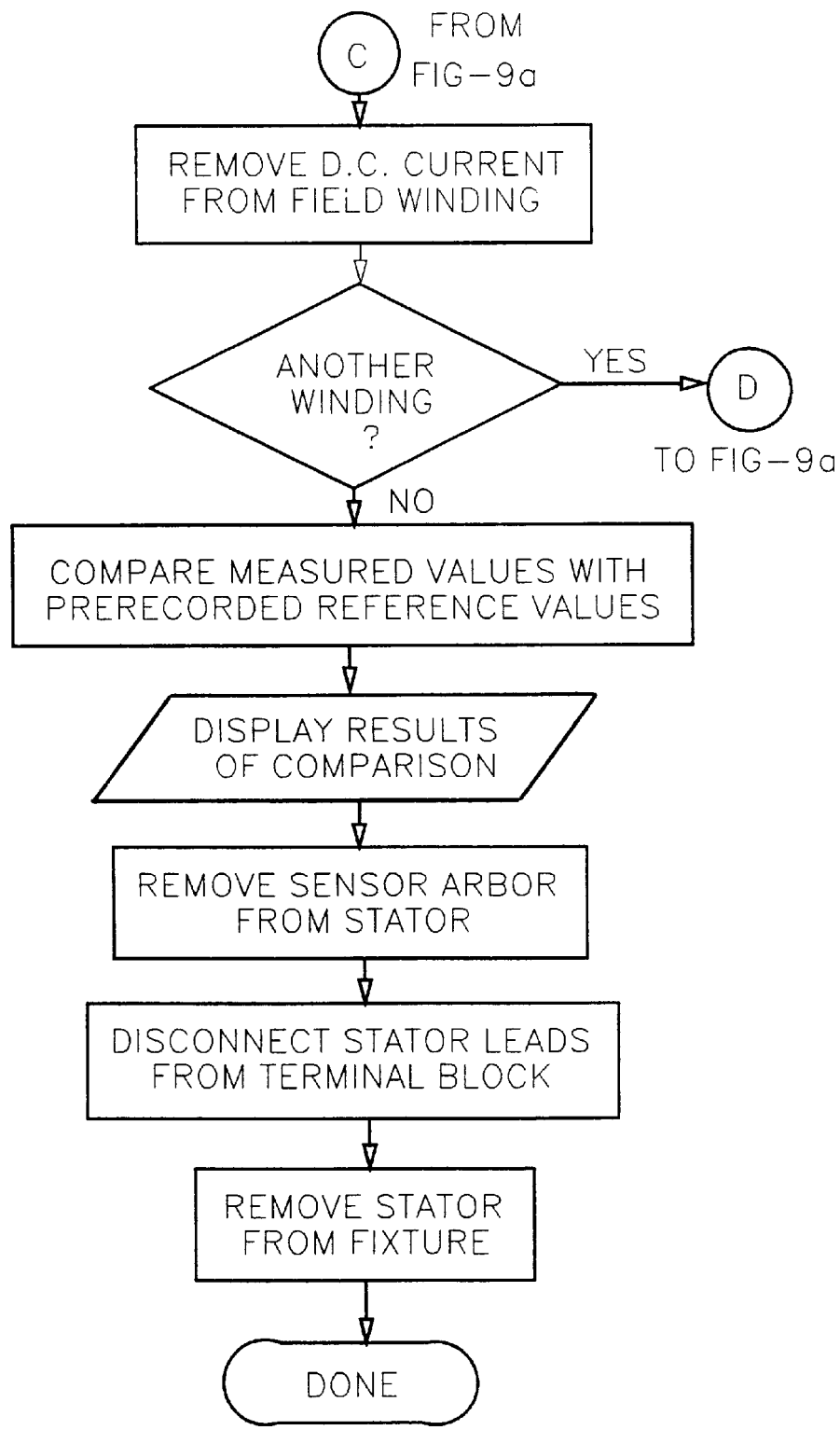

Turning now to FIGS. 8a, 8b, 9a, and 9b, flowcharts are shown depicting in more detail the steps involved in detecting winding errors in electric motor stators in accordance with the method of the present invention. FIGS. 8a and 8b depict the steps involved wherein a magnetic sensor at a predetermined radial position is rotated within the stator and operated to generate magnetic values as a function of angular position. FIGS. 9a and 9b depict the steps involved wherein a plurality of sensors mounted at preselected angular and radial positions are inserted into the stator and operated to sense magnetic values at the preselected angular and radial positions within the stator.

In either case, it may be seen that a method of detecting winding errors in an electric motor stator having a plurality of field windings may comprise the steps of: (1) successively applying a direct current source to each of said field windings; (2) for each of said field windings, and during the application of said direct current source thereto, generating sensing signals representing a component of a magnetic field vector at each of a plurality of angularly displaced positions within said electric motor stator; and (3) comparing said sensing signals to recorded values of angularly corresponding sensing signals for a reference motor stator.

Referring to FIGS. 8a and 8b, as well as FIGS. 1 and 2, one method for detecting winding errors in an electric motor stator 16 having a plurality of field windings 70 is depicted as comprising the steps of placing a stator 16 to be tested in a fixture 17 connecting each pair of external leads 14 for each field winding 70 temporarily to terminal block 18 connections, and positioning a magnetic sensor 30 mounted on a shaft 32 for rotation inside the stator bore 82. The sensor 30 is preferably mounted at a predetermined radial position with respect to the field windings 70. The first field winding 70 to be energized is selected by means of a microprocessor-controlled switch 18 that couples a d.c. current power supply 20 to the selected field winding 70 by means of the terminal block 12 thereby to generate a magnetic field within the stator 16.

The magnetic sensor 30 is then rotated at least one full revolution within the stator 16. As the magnetic sensor 30 rotates, its angular position is sensed by an encoder 38 and monitored by the microprocessor 42. As the magnetic sensor 30 reaches each of a plurality of preselected different angular positions, the microprocessor 42 reads the polarity and strength of the magnetic field from the sensor 30 and stores the information for later processing. After the magnetic field values have been measured for one energized field winding 70, the process is repeated for each successive field winding 70 until the magnetic fields for all field windings 70 have been measured.

The measured values of the magnetic fields are then compared with a set of angularly and radially corresponding stored values from a reference stator (not shown) having no winding errors. If the measured values are within acceptable ranges of the reference values, then the windings 70 are presumed to have no errors of the type detectable by this method. However, improper measured values may indicate a winding fault. For example, an inverted pole could indicate that a field winding 70 is wound backwards. A magnetic strength maximum that is higher (or lower) than expected could indicate that a winding 70 has too many (or too few) turns. Moreover, a magnetic zero or minimum displaced from its expected position could indicate that a field winding 70 is in the wrong slot 76.

While the measured values for each energized field winding 70 can be compared directly with the corresponding reference values, an alternative method is to first sum all of the measured values for the windings 70 that comprise each phase of the stator. That is, a magnetic field mapping is created for each electrical phase by superposing the individual magnetic maps for each winding that comprises a given phase. The maps of measured magnetic values for each phase are then compared with the reference magnetic maps for each phase. As indicated previously, discrepancies between measured values for each phase and the reference values for each phase can indicate which windings 70 are faulty, if any, and the nature of the fault.

The most preferred method of comparing the measured angular positioning for each field winding 70 with corresponding reference values involves first determining the angular locations of the zero crossings of the magnetic mapping for each winding. The measured angular positions of the zero crossings are then compared with reference zero crossing angular positions to determine whether the winding under test is oriented correctly within the stator and has the proper pole spacing.

It should be recognized from the foregoing discussion that fewer than all of the field windings may be tested, if desired. Likewise, a plurality of field windings, connected in either series or parallel arrangements, may be energized simultaneously and mapped. In any case, comparison of measured values would be made with reference values corresponding to stator windings energized under substantially the same conditions.

Once the comparisons have been made, the results may be displayed on a visual display unit 52, printed on a printer 54, or recorded on a disk drive 48 for later processing. The magnetic sensor 30 is then removed from the stator 16, the stator leads 14 are removed from the terminal block 18 connections, and the stator 16 is removed from the test fixture. The process is ready to begin again with another stator having field windings.

In FIGS. 9a and 9b, viewed in conjunction with FIGS. 3 and 4, an alternative method for detecting winding errors in an electric motor stator 16 including a plurality of field windings 70, each having a pair of external leads 14 is presented. The alternative method uses most of the same steps as the first method, except that instead of using a rotating sensor 30, the alternative method employs a plurality of magnetic field sensors 130, mounted or supported at preselected angular and radial positions with respect to the windings 70 about a drum or arbor 172, that do not require rotation within the stator 16.

After the sensors 130 are inserted within the stator 16 and the selected field winding 70 is energized, each of the sensors 130 is selected or operated in turn and its output read by a microprocessor 142. The measured values of magnetic polarity and strength are saved for later processing. The process is repeated for each sensor 130 until all have been read. The selected field winding 70 is de-energized and the next field winding 70 is selected and energized. As before, all of the sensing signals generated by the sensors 130 are read and saved. The process continues until all of the magnetic fields for all of the stator field windings 70 have been measured. As before, the measured values are then compared with the recorded values of angularly and radially corresponding sensing signals for a reference motor stator (not shown) having error-free windings.

Figure 10:
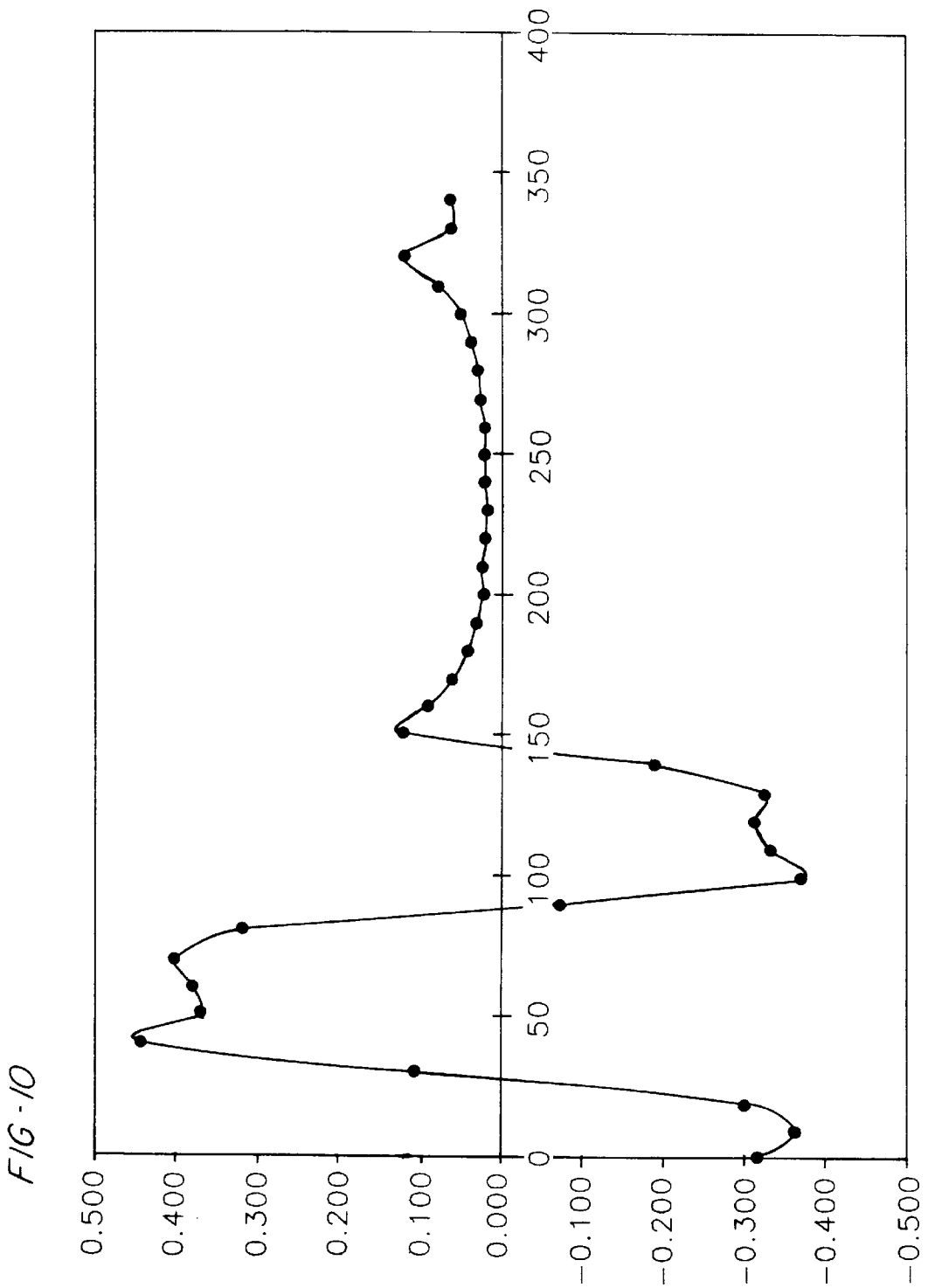
FIG. 10 is a plot of magnetic field values obtained in accordance with the method and apparatus of the invention when d.c. current is applied to terminals T1 and T4 of the field windings of the stator depicted in FIGS. 5 and 6.
Figure 11:
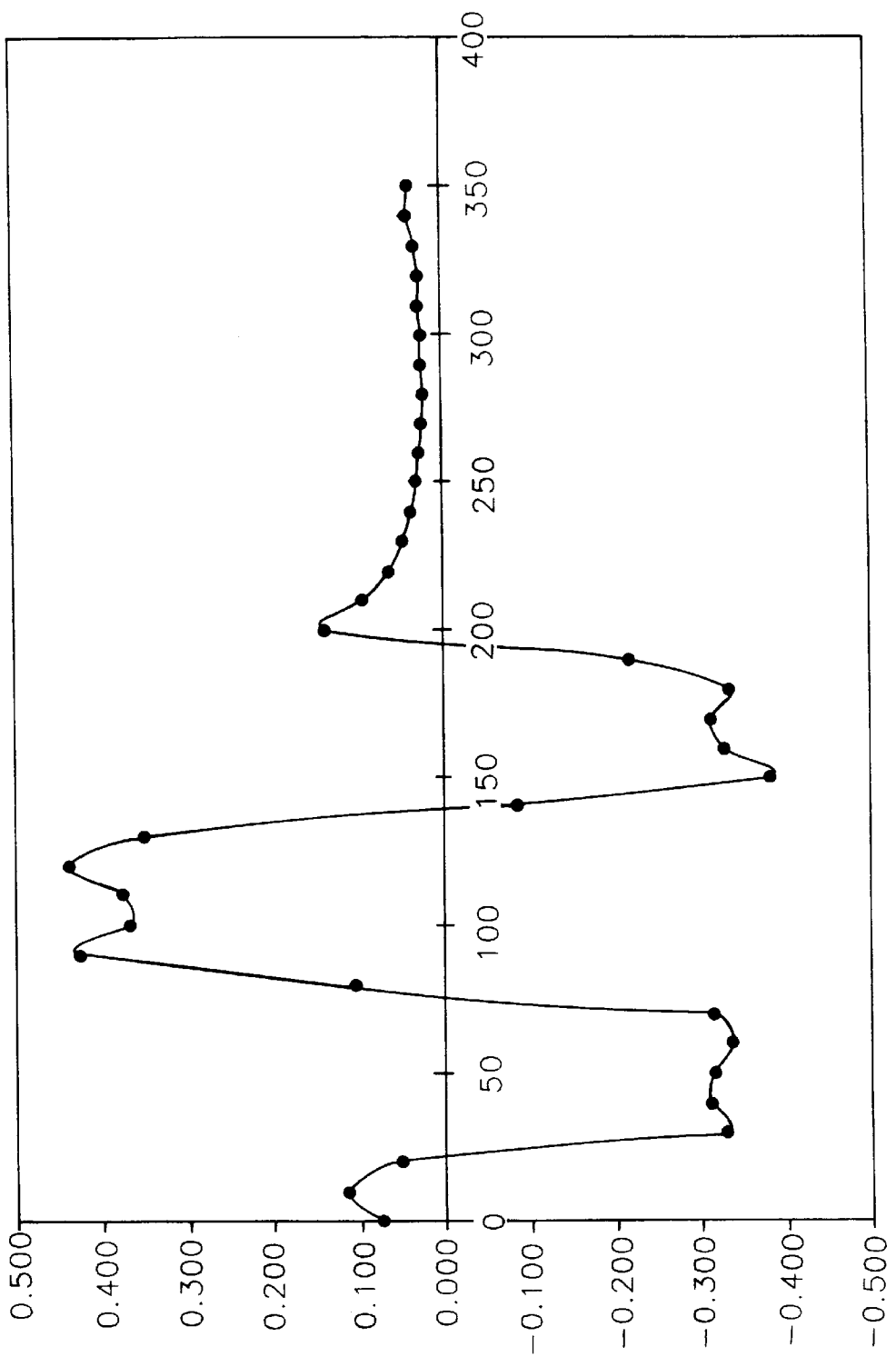
FIG. 11 is a plot of magnetic field values obtained in accordance with the method and apparatus of the invention when d.c. current is applied to terminals T2 and T5 of the field windings of the stator depicted in FIGS. 5 and 6.
Figure 12:
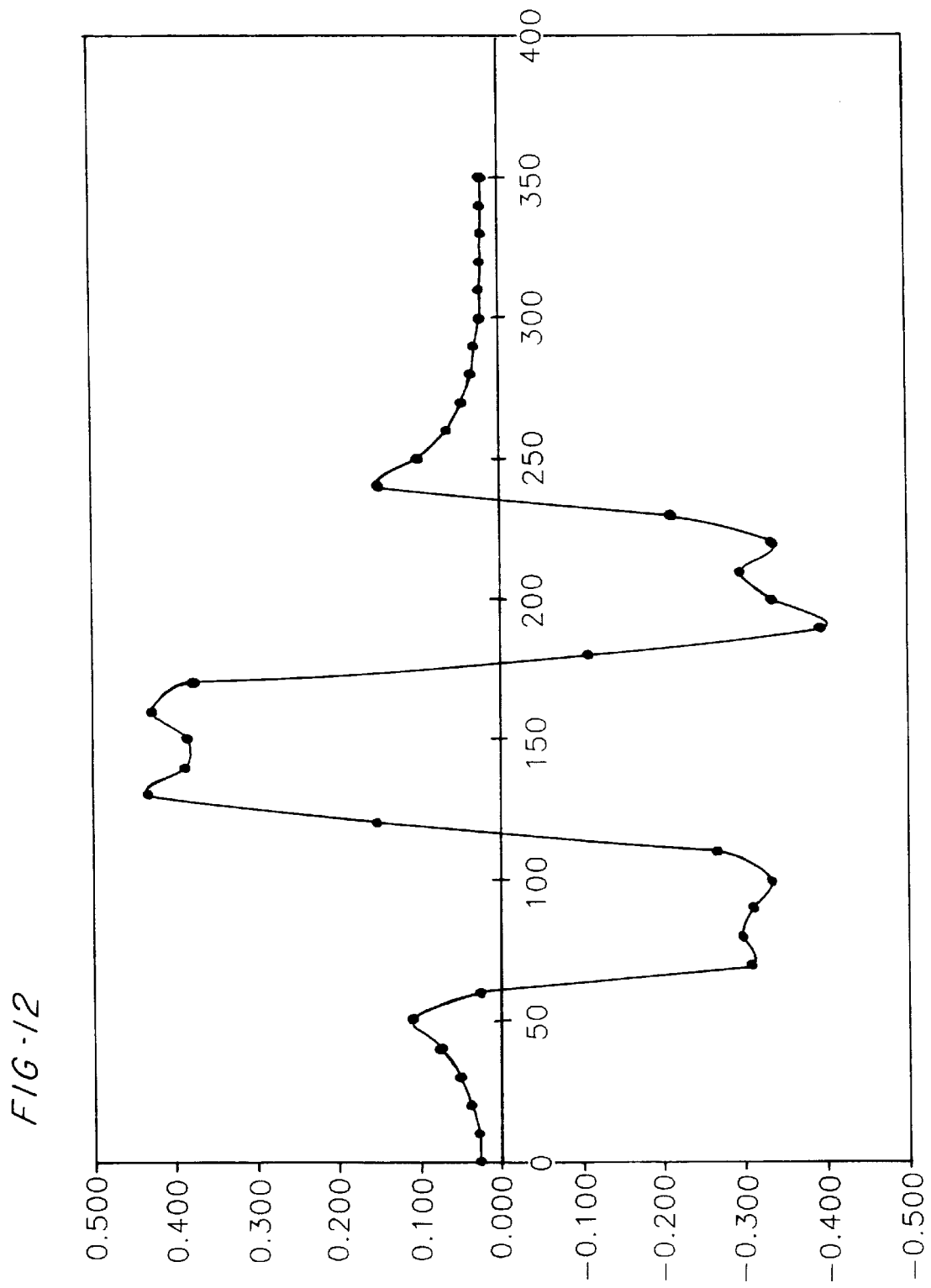
FIG. 12 is a plot of magnetic field values obtained in accordance with the method and apparatus of the invention when d.c. current is applied to terminals T3 and T6 of the field windings of the stator depicted in FIGS. 5 and 6.
Figure 13:
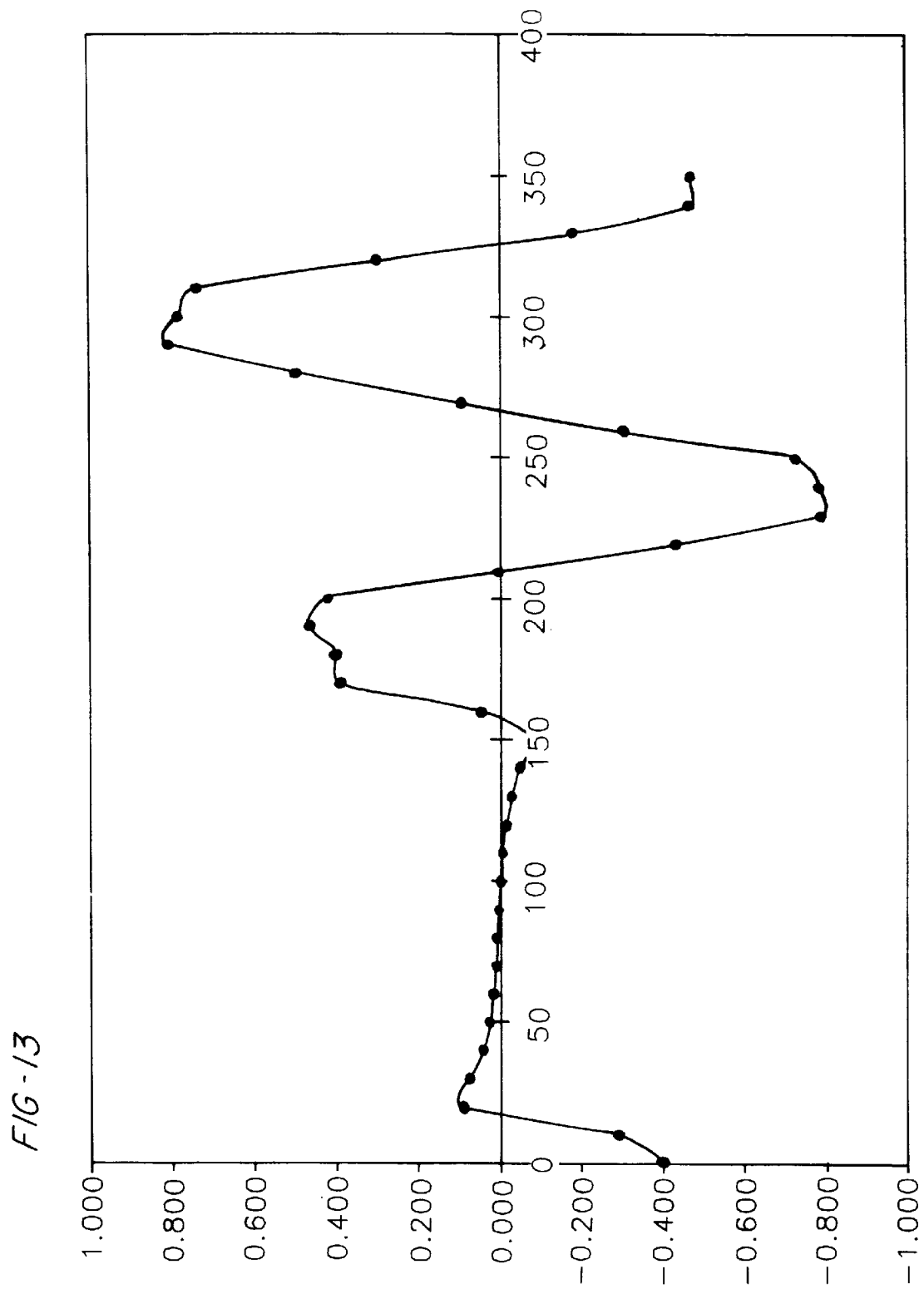
FIG. 13 is a plot of magnetic field values obtained in accordance with the method and apparatus of the invention when d.c. current is applied to terminals T7 and T8 of the field windings of the stator depicted in FIGS. 5 and 6.
Figure 14:
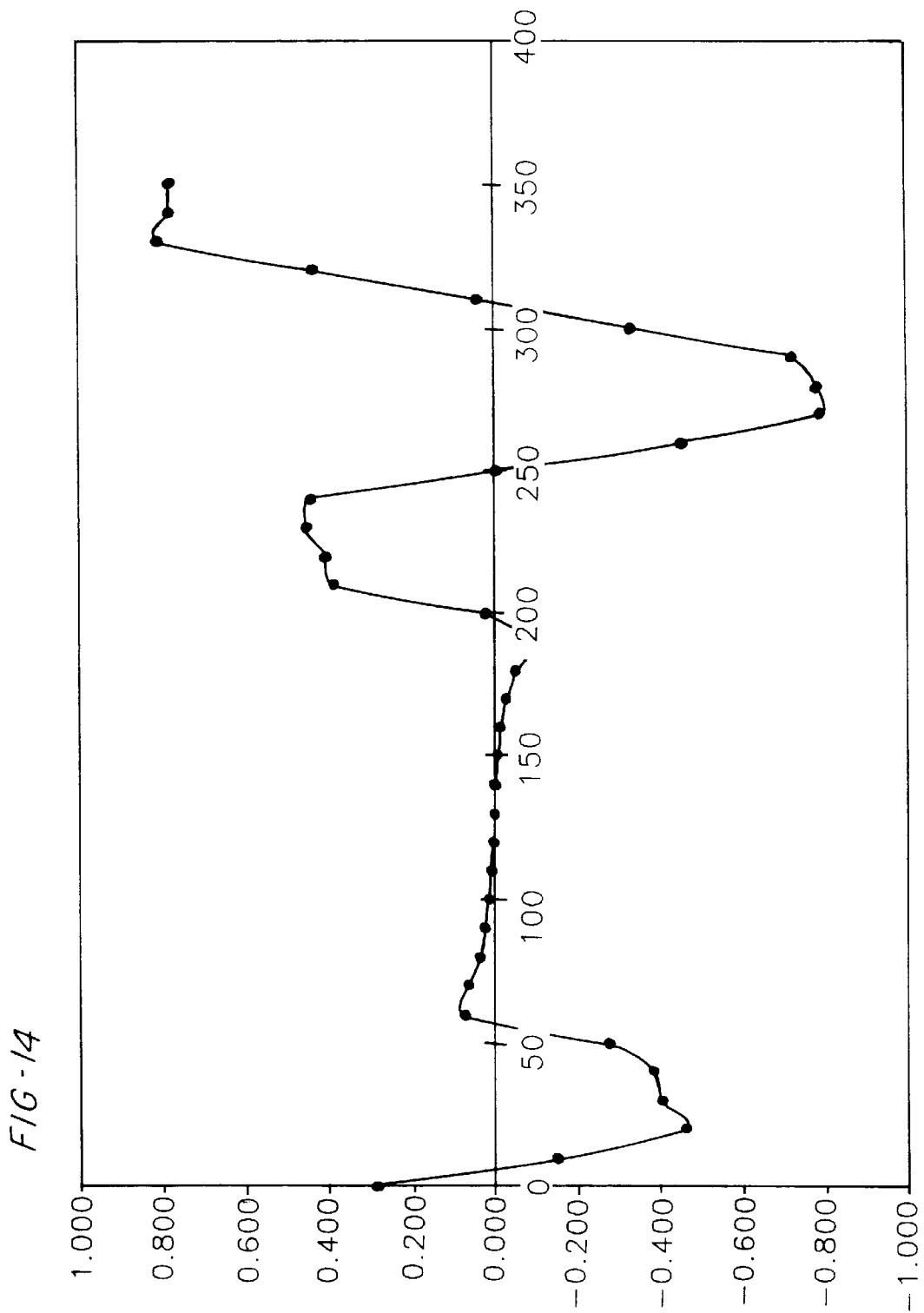
FIG. 14 is a plot of magnetic field values obtained in accordance with the method and apparatus of the invention when d.c. current is applied to terminals T8 and T9 of the field windings of the stator depicted in FIGS. 5 and 6.
Figure 15:
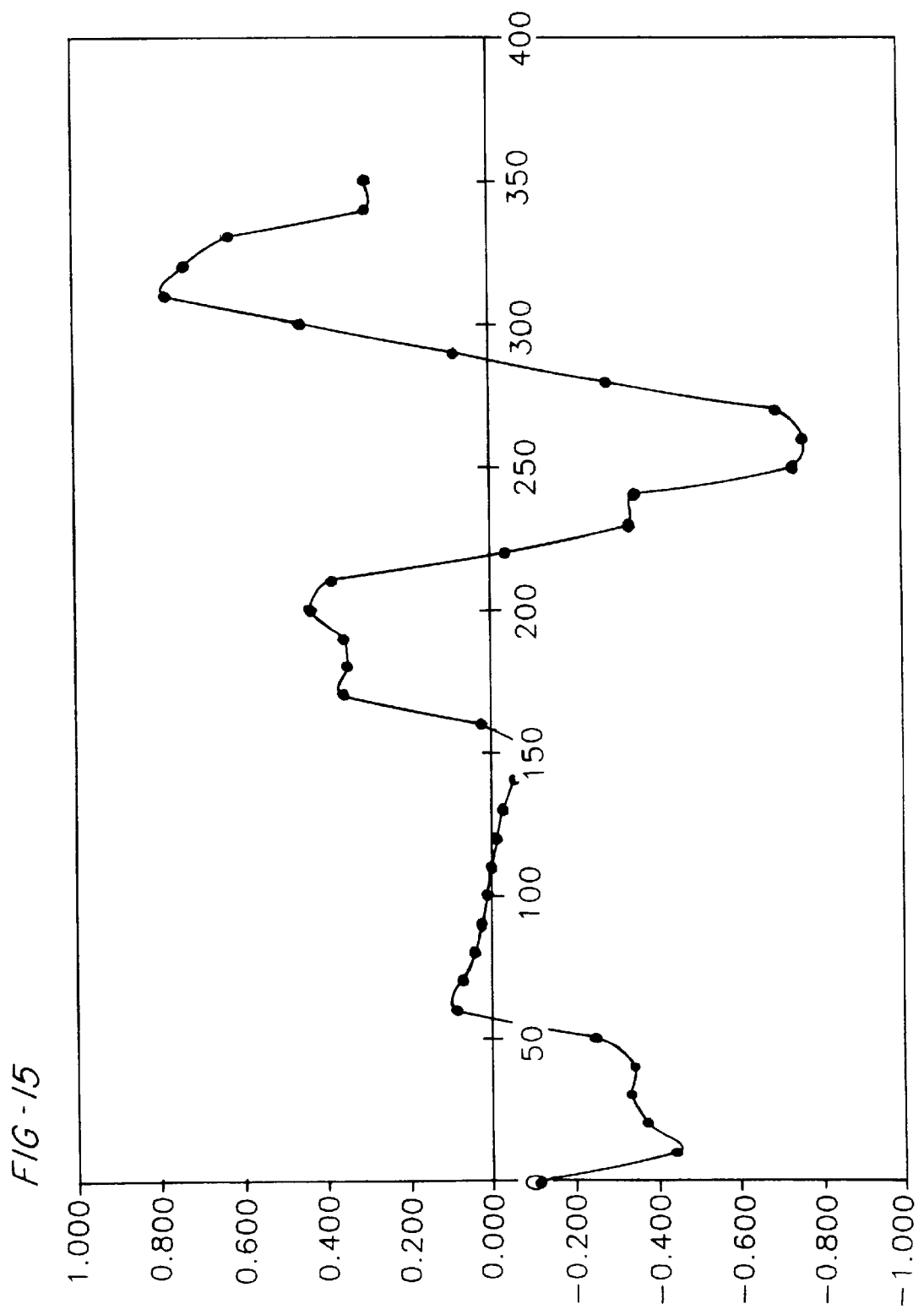
FIG. 15 is a plot of magnetic field values obtained in accordance with the method and apparatus of the invention when d.c. current is applied to terminals T9 and T7 of the field windings of the stator depicted in FIGS. 5 and 6.
Figure 16:
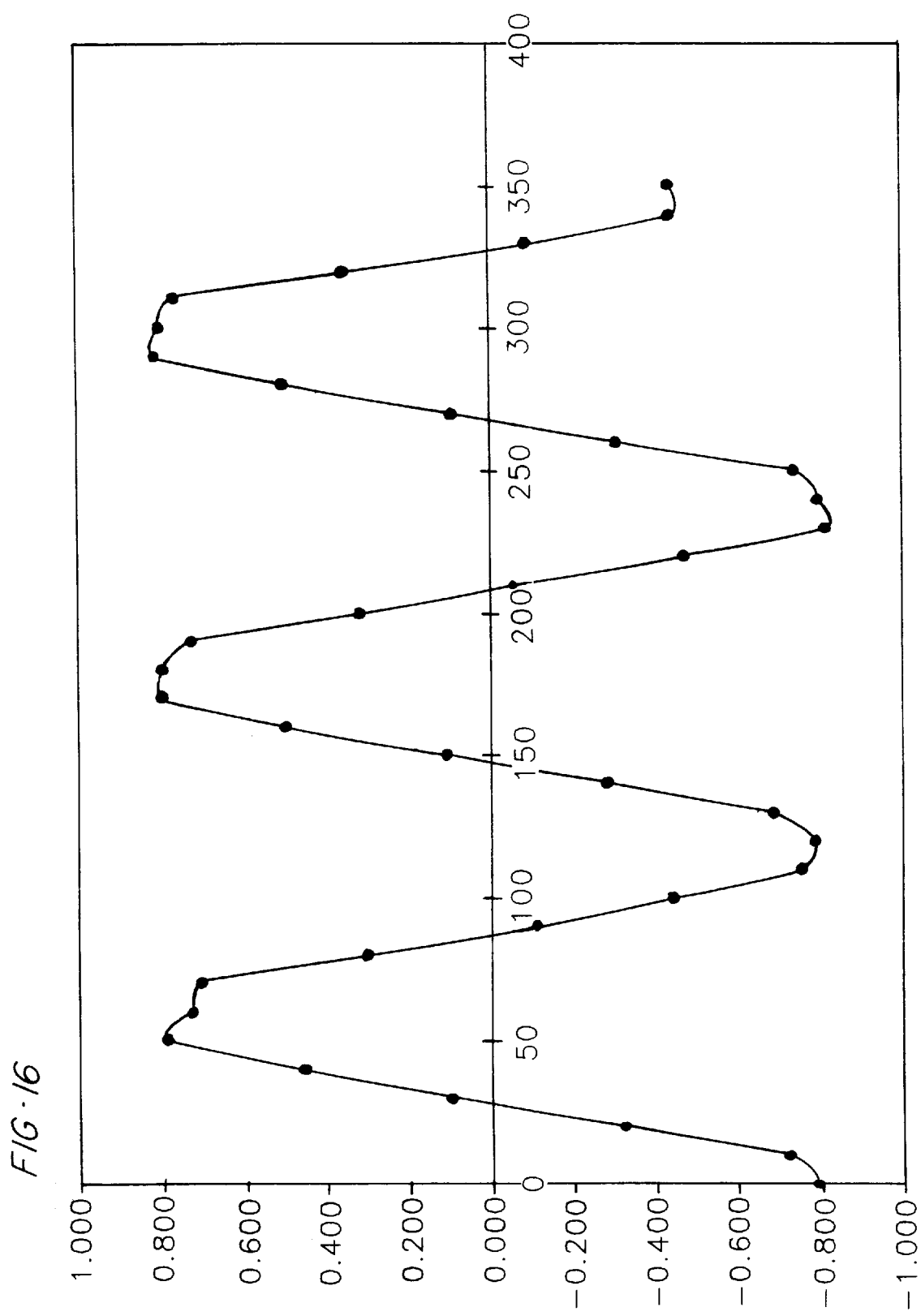
FIG. 16 is a plot of magnetic field values for phase A of the stator of FIGS. 5 and 6 obtained when the plots of FIGS. 10, 11, and 13 are superposed.
Figure 17:
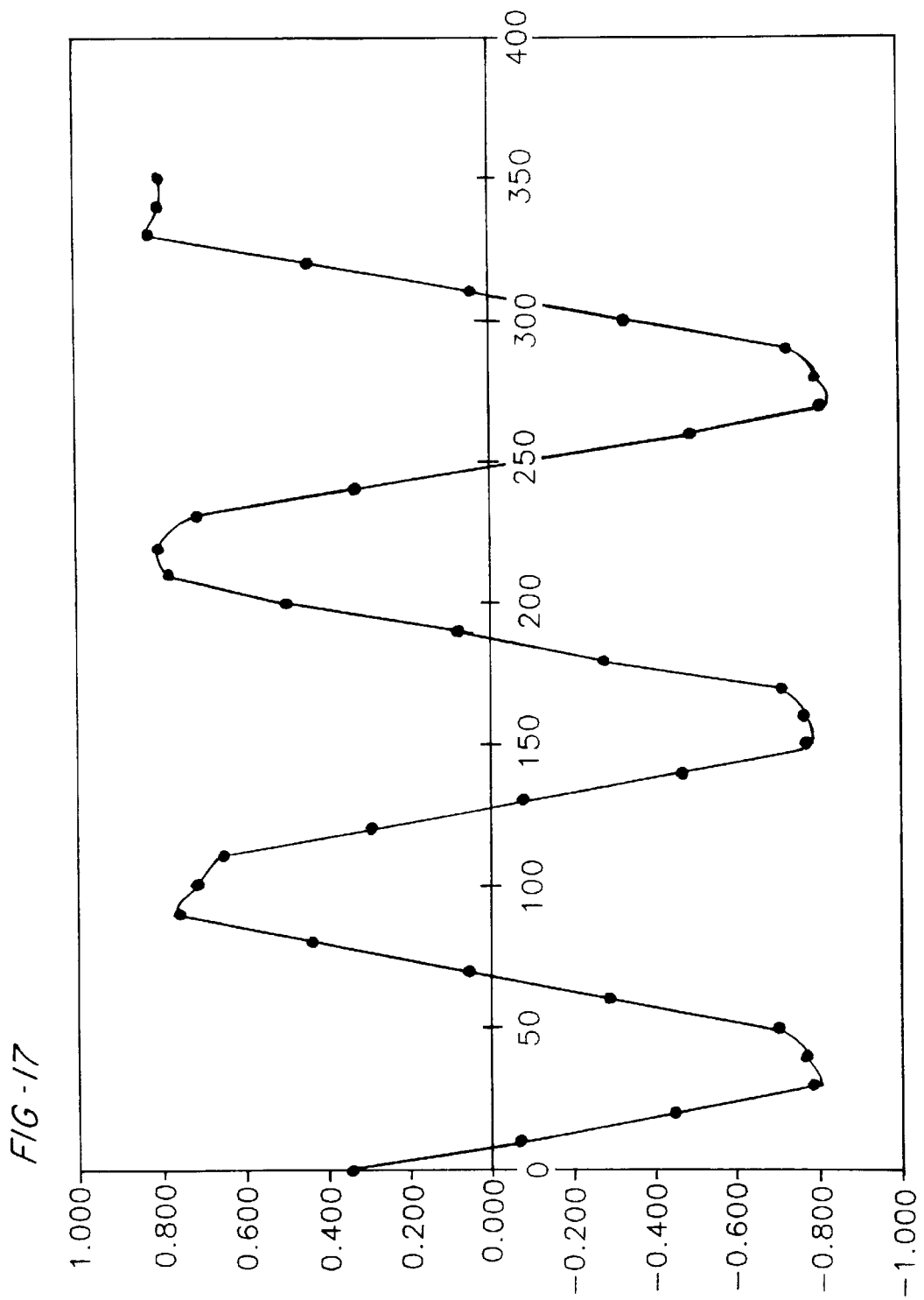
FIG. 17 is a plot of magnetic field values for phase B of the stator of FIGS. 5 and 6 obtained when the plots of FIGS. 11, 12, and 14 are superposed.
Figure 18:
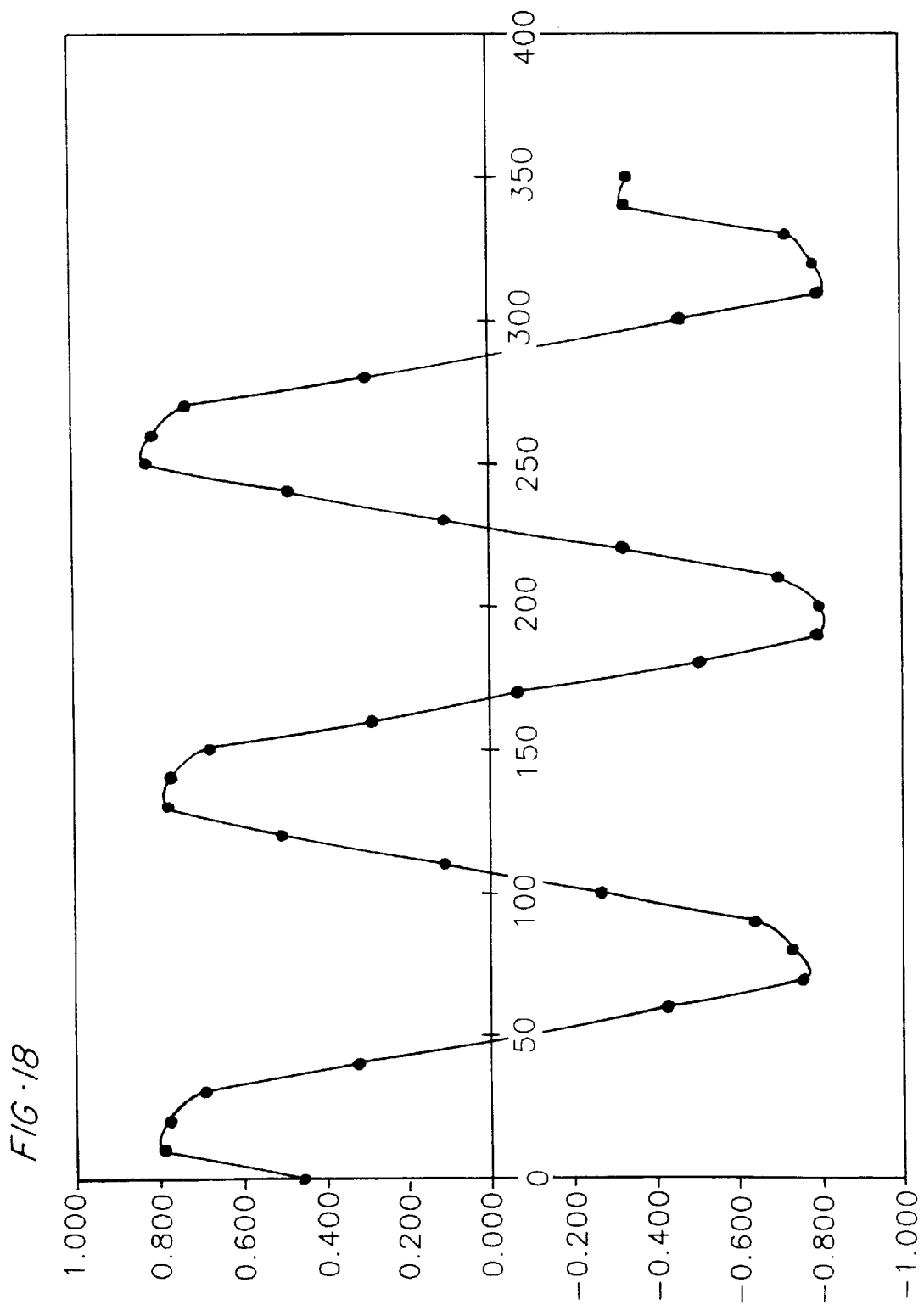
FIG. 18 is a plot of magnetic field values for phase C of the stator of FIGS. 5 and 6 obtained when the plots of FIGS. 10, 12, and 15 are superposed.

Representative measured magnetic field values obtained by the method and apparatus of the present invention may be seen in FIGS. 10–18 wherein FIG. 10 represents the values obtained when the field winding corresponding to terminals T1 to T4 of the three-phase, six-pole, wye-connected stator of FIGS. 5 and 6 is energized. Likewise, FIG. 11 represents the values obtained from the winding corresponding to terminals T2 to T5; FIG. 12 represents the values obtained from the winding corresponding to terminals T3 to T6; FIG. 13 represents the values obtained from the winding corresponding to terminals T7 to T8; FIG. 14 represents the values obtained from the winding corresponding to terminals T8 to T9; and FIG. 15 represents the values obtained from the winding corresponding to terminals T9 to T7. FIGS. 16–18 represent the measured values for each phase A, B, and C, respectively, after the corresponding field winding measurements have been superposed.

While the methods of detecting or testing according to the present invention have been described above, it should be noted that the order of some of the steps could be changed, new steps added, or some steps combined with other steps, without departing from the scope of the invention.

While the forms of apparatus and methods herein described constitute preferred embodiments of this invention, it is to be understood that the invention is not limited to these precise forms of apparatus and methods, and that changes may be made therein without departing from the scope of the invention which is defined in the appended claims.

What is claimed is:

1. A method of detecting a winding error in an electric motor stator including a field winding, said method comprising the steps of:

(1) applying a predetermined current to said field winding to generate a magnetic field within said stator;

(2) during application of said current to said field winding, generating a sensing signal representing a component of a magnetic field vector of said magnetic field at a predetermined circumferentially angularly disposed position within said stator; and (3) comparing said sensing signal to an angularly corresponding sensing signal for a reference motor stator to detect said winding error when said generated sensing signal differs from said angularly corresponding sensing signal by more than a predetermined amount.

2. A method of detecting according to claim 1 wherein:

in said step of generating, a plurality of sensing signals are generated by positioning a magnetic field sensor at a plurality of different angular positions relative to said field winding during application of said current thereto; and in said step of comparing, said plurality of generated sensing signals are compared to a plurality of angularly corresponding sensing signals for a reference motor stator.

3. A method of detecting according to claim 1 wherein:

in said step of generating, a plurality of sensing signals are generated by placing a plurality of magnetic field sensors at a plurality of different angular positions relative to said field winding during application of said current thereto: and in said step of comparing, said plurality of generated sensing signals are compared to a plurality of angularly corresponding sensing signals for a reference motor stator.

4. A method according to claim 1 wherein said electric motor stator includes a plurality of field windings and said current is successively applied to each of said plurality of field windings of said stator.

5. A method of detecting winding errors in an electric motor stator including a plurality of field windings each having a pair of external leads comprising the steps of:

(A) connecting at least one of said pair of external leads to a source of current thereby to generate a magnetic field within said stator;

(B) rotating at least one magnetic field sensor to a plurality of predetermined different angular positions within said stator;

(C) operating said at least one magnetic field sensor to sense the polarity and strength of said magnetic field at said plurality of predetermined different angular positions within said stator; and (D) comparing said polarity and said strength of said magnetic field at said angular positions within said stator with reference values for polarity and strength of a magnetic field at corresponding angular positions within a reference electric motor stator to detect a winding error whenever said polarity differs from said reference value for polarity, and whenever said strength differs from said reference value for strength by more than a predetermined amount.

6. A method according to claim 5 wherein said step of connecting comprises connecting each said pair of leads successively to a source of current thereby to generate a magnetic field within said stator and said step of rotating is performed for each said pair of leads connected.

7. A method of detecting winding errors in an electric motor stator including a plurality of field windings each having a pair of external leads comprising the steps of:

(A) connecting at least one of said pair of external leads to a source of current thereby to generate a magnetic field within said stator;

(B) positioning a plurality of magnetic field sensors at predetermined different angular positions within said stator;

(C) operating said magnetic field sensors to sense the polarity and strength of said magnetic field at said angular positions within said stator; and (D) comparing said polarity and strength of said magnetic field at said angular positions within said stator with reference values for polarity and strength of a magnetic field at corresponding angular positions within a reference electric motor stator to detect a winding error whenever said polarity differs from said reference value for polarity, and whenever said strength differs from said reference value for strength by more than a predetermined amount.

8. A method according to claim 7 wherein said step of connecting comprises connecting each said pair of leads successively to a source of current thereby to generate a magnetic field within said stator and said step of positioning is performed for each said pair of leads connected.

9. An apparatus for detecting a winding error in an electric motor stator including a field winding, said apparatus comprising:

current source means for applying a current to said field winding to generate a magnetic field within said stator;

means for generating a sensing signal representing a component of a magnetic field vector of said magnetic field at a predetermined angularly displaced position within said electric motor stator; and means for comparing said sensing signal to an angularly corresponding sensing signal for a reference motor stator to detect said winding error when said sensing signal differs from said angularly corresponding sensing signal by more than a predetermined amount.

10. An apparatus for detecting according to claim 9 wherein said means for generating a sensing signal comprises:

at least one magnetic field sensor; and means for positioning said at least one magnetic field sensor at a plurality of different angular positions relative to said field winding during application of said current thereto.

11. An apparatus for detecting according to claim 9 wherein said means for generating a sensing signal comprises:

a plurality of magnetic field sensors; and means for supporting said magnetic field sensors at a plurality of different angular positions relative to said field winding during application of said current thereto.

12. An apparatus for detecting according to claim 9 wherein said electric motor stator includes a plurality of field windings and said current source means comprises current source means for successively applying a current to each of said field windings.

13. An apparatus for detecting winding errors in an electric motor stator having a plurality of field windings comprising:

a fixture adapted to hold said stator to be tested;

a terminal block adapted to make temporary electrical connection to said plurality of field windings;

means for applying current to at least one of said plurality of field windings via said terminal block to generate a magnetic field within said stator;

means for sensing each said magnetic field as a function of angular position within said stator, said means for sensing providing sensing signals representative of said magnetic field; and means for comparing said sensing signals with corresponding reference signals representative of a reference magnetic field of a reference motor stator to detect winding errors when said sensing signals differ from said corresponding reference signals by more than a predetermined amount.

14. An apparatus for detecting according to claim 13 wherein said means for sensing comprises:

a magnetic field sensor;

means for positioning said magnetic field sensor at a plurality of different angular positions relative to each of said field windings during application of said means for applying current thereto; and means for sensing said angular position of said magnetic field sensor.

15. An apparatus for detecting according to claim 13 wherein said means for sensing comprises:

a plurality of magnetic field sensors positioned at a plurality of preselected angular positions within said electric motor stator.

16. An apparatus for detecting according to claim 13 wherein said means for applying current comprises means for successively applying current to each of said plurality of field windings via said terminal block to generate a magnetic field within said stator.

* * * * *